US012772542B2

(12) United States Patent
Hu et al.

(10) Patent No.: US 12,772,542 B2
(45) Date of Patent: Oct. 20, 2026

(54) MULTI-THRESHOLD VOLTAGE SEMICONDUCTOR DEVICE AND METHOD FOR FABRICATING SAME

(71) Applicant: Hangzhou HFC Semiconductor Co., Hangzhou (CN)

(72) Inventors: Mingyu Hu, Dalian (CN); Liang Li, Singapore (SG); Shuangyun Dou, Beijing (CN); Byunghak Lee, Hangzhou (CN); Chien Tsai Li, Hsinchu City (CN)

(73) Assignee: Hangzhou HFC Semiconductor Co., Hangzhou (CN)

( * ) Notice: Subject to any disclaimer, the term of this patent is extended or adjusted under 35 U.S.C. 154(b) by 396 days.

(21) Appl. No.: 18/538,314

(22) Filed: Dec. 13, 2023

(65) Prior Publication Data

US 2025/0120164 A1 Apr. 10, 2025

(30) Foreign Application Priority Data

Oct. 10, 2023 (CN) ........................ 202311311061.5

(51) Int. Cl.

| | |
|---|---|
| ***H10D 84/03*** | (2025.01) |
| ***H10D 84/01*** | (2026.01) |
| ***H10D 84/83*** | (2025.01) |
| ***H10D 84/85*** | (2025.01) |

(52) U.S. Cl.

CPC ....... *H10D 84/038* (2025.01); *H10D 84/0144* (2025.01); *H10D 84/0181* (2025.01); *H10D 84/83* (2025.01); *H10D 84/85* (2025.01)

(58) Field of Classification Search

CPC ............. H10D 84/038; H10D 84/0144; H10D 84/0181; H10D 84/83; H10D 84/85; H10D 84/8314; H10D 84/0172; H10D 84/856

See application file for complete search history.

(56) References Cited

U.S. PATENT DOCUMENTS

| | | | | |
|---|---|---|---|---|
| 7,888,195 | B2 * | 2/2011 | Lin | H10D 64/017 438/188 |
| 8,698,249 | B2 | 4/2014 | Mise et al. | |
| 9,431,304 | B2 * | 8/2016 | Huang | H10D 64/667 |
| 9,755,039 | B2 * | 9/2017 | Tsau | H10D 64/671 |
| 10,049,940 | B1 * | 8/2018 | Chen | H10D 64/01338 |
| 10,497,626 | B2 * | 12/2019 | Chen | H10D 64/01338 |
| 11,114,347 | B2 * | 9/2021 | Huang | H10D 64/017 |

(Continued)

*Primary Examiner* — Steven H Loke
*Assistant Examiner* — Khatib A Rahman
(74) *Attorney, Agent, or Firm* — MUNCY, GEISSLER, OLDS & LOWE, P.C.

(57) ABSTRACT

A multi-threshold voltage semiconductor device and a method for fabricating the device are disclosed, in which a first metal material layer is formed on exposed dielectric layer in a part of gate trenches, and an annealing process is then carried out to cause diffusion of metal ions from the first metal material layer into the corresponding portion(s) of the high-k dielectric layer. In this way, two different threshold voltages can be achieved simply with one photolithography process and one etching process. More different threshold voltages can be achieved by adding photolithography processes. As fewer photolithography and etching processes are involved, the multi-threshold voltage semiconductor device can be fabricated at lower cost and exhibits improved consistency.

8 Claims, 10 Drawing Sheets

(56) References Cited

U.S. PATENT DOCUMENTS

| | | | | |
|---|---|---|---|---|
| 11,289,578 | B2 * | 3/2022 | Lee | H10D 30/024 |
| 2010/0052074 | A1 * | 3/2010 | Lin | H10D 64/017<br>257/E47.001 |
| 2013/0026578 | A1 * | 1/2013 | Tsau | H10D 64/671<br>257/E27.06 |
| 2013/0214336 | A1 * | 8/2013 | Hsu | H10P 14/44<br>257/E21.585 |
| 2013/0280900 | A1 * | 10/2013 | Lai | H10D 84/0177<br>438/589 |

* cited by examiner

MULTI-THRESHOLD VOLTAGE SEMICONDUCTOR DEVICE AND METHOD FOR FABRICATING SAME

CROSS-REFERENCE TO RELATED APPLICATION

This application claims the priority of Chinese patent application number 202311311061.5, filed on Oct. 10, 2023 and entitled "MULTI-THRESHOLD VOLTAGE SEMICONDUCTOR DEVICE AND METHOD FOR FABRICATING SAME", the entire contents of which are incorporated herein by reference.

TECHNICAL FIELD

The present invention relates to the field of semiconductor technology and, in particular, to a multi-threshold voltage semiconductor device and a method for fabricating the device.

BACKGROUND

Contemporary semiconductor devices generally include different combinations of transistors in order to provide various functions. Different transistors integrated in a single semiconductor device are usually required to have different threshold voltages (Vt), that is, a multi-threshold voltage is desired to be formed in a single semiconductor device. Conventionally, in order to fabricate a device with two different threshold voltages, it is usually necessary to deposit and stack multiple layers of lanthanum oxide and titanium nitride and carry out multiple etching processes thereon. This tends to lead to high cost, poor consistency and other problems with the resulting multi-threshold voltage semiconductor device.

SUMMARY OF THE INVENTION

It is an object of the present invention to solve the problems of high cost and poor consistency associated with conventional multi-threshold voltage semiconductor devices by presenting a novel multi-threshold voltage semiconductor device and method for fabricating the device.

The above object is attained in the present invention by providing a method for fabricating a multi-threshold voltage semiconductor device, which comprises:

- providing a substrate, wherein the substrate comprises a semiconductor substrate and an interlayer dielectric layer formed on the semiconductor substrate, wherein at least two gate trenches are formed in the interlayer dielectric layer, and wherein a dielectric layer is formed in the gate trenches;
- forming a first barrier layer covering the dielectric layer;
- exposing the dielectric layer in a part of the gate trenches by performing photolithography and etching processes on the first barrier layer;
- forming a first metal material layer covering the exposed dielectric layer and a remaining portion of the first barrier layer;
- forming a second barrier layer covering the first metal material layer;
- removing the second barrier layer and the first metal material layer that are located above the remaining portion of the first barrier layer by a chemical mechanical polishing (CMP);
- performing an annealing process to cause diffusion of metal ions from the first metal material layer into at least one corresponding portion of the dielectric layer;
- removing the second barrier layer, the first metal material layer and the first barrier layer, thereby exposing the dielectric layer; and
- forming a work function layer and gate electrodes in the gate trenches, so as to form a gate structure in each trench.

The present invention also provides a multi-threshold voltage semiconductor device, comprising:

- a semiconductor substrate;
- an interlayer dielectric layer formed on the semiconductor substrate, wherein at least two gate trenches are formed in the interlayer dielectric layer; and
- gate structures formed in the gate trenches, wherein each gate structure comprises a portion of a dielectric layer, a portion of a work function layer located over the dielectric layer and a gate electrode located over the work function layer, wherein corresponding portions of the dielectric layer in the at least two gate structures differ because of different metal ion diffusion conditions.

In the multi-threshold voltage semiconductor device and method of the present invention, the first metal material layer is first formed on the exposed dielectric layer in some of the gate trenches, and the annealing process is then carried out to cause diffusion of metal ions from the first metal material layer into the corresponding portion(s) of the dielectric layer. In this way, two different threshold voltages can be achieved simply with one photolithography process and one etching process. More different threshold voltages can be achieved by adding photolithography processes. As fewer photolithography and etching processes are involved, the multi-threshold voltage semiconductor device can be fabricated at lower cost and exhibits improved consistency.

Figure 1:
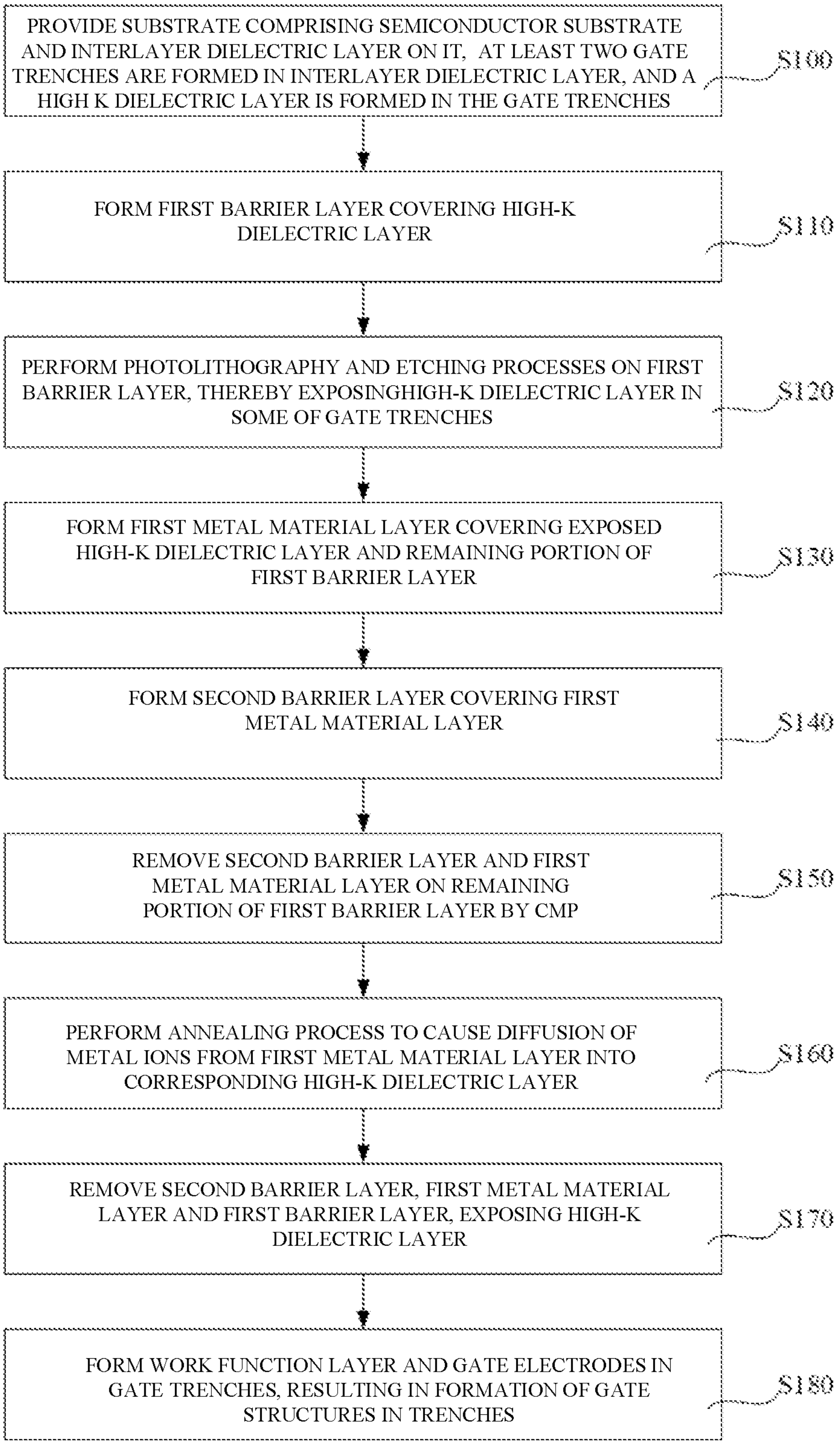
FIG. 1 is a schematic flow diagram of a method for fabricating a multi-threshold voltage semiconductor device according to Embodiment 1 of the present invention.

In figures,

100, a substrate; 110, a semiconductor substrate; 112, a first region; 114, a second region; 120, an interlayer dielectric layer; 122, a gate trench; 124, a gate dielectric layer; 126, a spacer; 130, 130', a high-k dielectric layer; 140, 140', a first barrier layer; 142, a first titanium nitride layer; 144, a first amorphous silicon layer; 150, 150', a first metal material layer; 160, 160', a second barrier layer; 162, a second titanium nitride layer; 164, a second amorphous silicon layer; 170, a gate structure; 172, a work function layer; 174, a gate electrode;

200, a substrate; 210, a semiconductor substrate; 212, a first region; 214, a second region; 216, a third region; 218, a fourth region; 220, an interlayer dielectric layer; 222, a gate trench; 224, a gate dielectric layer; 226, a spacer; 230, 230', 230", a high-k dielectric layer; 232, 232', a second metal material layer; 234, an isolation layer; 240, 240', a first barrier layer; 242, a first titanium nitride layer; 244, a first amorphous silicon layer; 250, 250', a first metal material layer; 260, 260', a second barrier layer; 262, a second titanium nitride layer; 264, a second amorphous silicon layer; 270, a gate structure; 272, a work function layer; and 274, a gate electrode.

DETAILED DESCRIPTION

The multi-threshold voltage semiconductor device and method proposed in the present invention will be described in greater detail below with reference to the accompanying drawings and specific embodiments. From the following description and the appended claims, advantages and features of this invention will become more apparent. Note that the figures are provided in a very simplified form not necessarily drawn to exact scale and only for the sake of easier and clearer description of the embodiments disclosed herein.

The terminology used herein is used for the purpose of describing particular embodiments only, and is not intended to limit the scope of the present invention. Unless defined otherwise herein, all technical and scientific terms used herein have the same meaning as commonly understood by one of ordinary skill in the art to which the invention belongs. As used herein and in the appended claims, the terms "first," "second," and the like do not denote any order, quantity, or importance, but rather are used to distinguish one element from another. Likewise, the terms "a" and "an" do not denote a limitation of quantity, but rather denote the presence of at least one of the referenced items. The terms "plurality" or "several" means two or more than two. Unless defined otherwise herein, the terms "upper/upper layer", "lower/lower layer" and/or the like used herein are merely for ease of description, and should not be construed as being limited to a particular position or a particular spatial orientation. The use of "including" or "comprising" or the like herein is meant to encompass the elements or items listed thereafter and equivalents thereof but do not preclude the presence of other elements or items. The terms "connected", "coupled" or the like are not restricted to physical or mechanical connections or couplings, and can include electrical connections or couplings, whether direct or indirect. As used herein and in the appended claims, the singular forms "a", "an", and "the" are intended to include the plural forms as well, unless the context clearly indicates otherwise. It will be also understood that, as used herein, the term "and/or" includes any and all combinations of one or more of the associated listed items.

In principle, the present invention seeks to provide a multi-threshold voltage semiconductor device and a method for fabricating the device, in which a first metal material layer is formed on exposed dielectric layer (here, optionally, high dielectric-constant ("high-k") dielectric layer) in some of gate trenches, and an annealing process is then carried out to cause diffusion of metal ions from the first metal material layer into the corresponding portion(s) of the high-k dielectric layer. In this way, two different threshold voltages can be achieved simply with one photolithography process and one etching process. More different threshold voltages can be achieved by adding photolithography processes. As fewer photolithography and etching processes are involved, the multi-threshold voltage semiconductor device can be fabricated at lower cost and exhibits improved consistency.

Embodiment 1

Reference is now made to FIG. 1, a schematic flow diagram of a method for fabricating a multi-threshold voltage semiconductor device according to Embodiment 1 of the present invention. As shown in FIG. 1, the method according to Embodiment 1 includes:

S100: providing a substrate comprising a semiconductor substrate and an interlayer dielectric layer on the semiconductor substrate, wherein the interlayer dielectric layer is formed therein with at least two gate trenches, and wherein a high-k dielectric layer is formed in the gate trenches;

S110: forming a first barrier layer covering the high-k dielectric layer;

S120: exposing the high-k dielectric layer in some of the gate trenches by performing photolithography and etching processes on the first barrier layer;

S130: forming a first metal material layer covering the exposed high-k dielectric layer and the remaining portion of the first barrier layer;

S140: forming a second barrier layer covering the first metal material layer;

S150: removing the second barrier layer and the first metal material layer on the remaining portion of the first barrier layer by chemical mechanical polishing (CMP);

S160: performing an annealing process to cause diffusion of metal ions from the first metal material layer into the corresponding portion(s) of high-k dielectric layer;

S170: removing the second barrier layer, the first metal material layer and the first barrier layer, thereby exposing the high-k dielectric layer; and

S180: forming a work function layer and gate electrodes in the gate trenches, thereby forming a gate structure in the trench.

Figure 9:
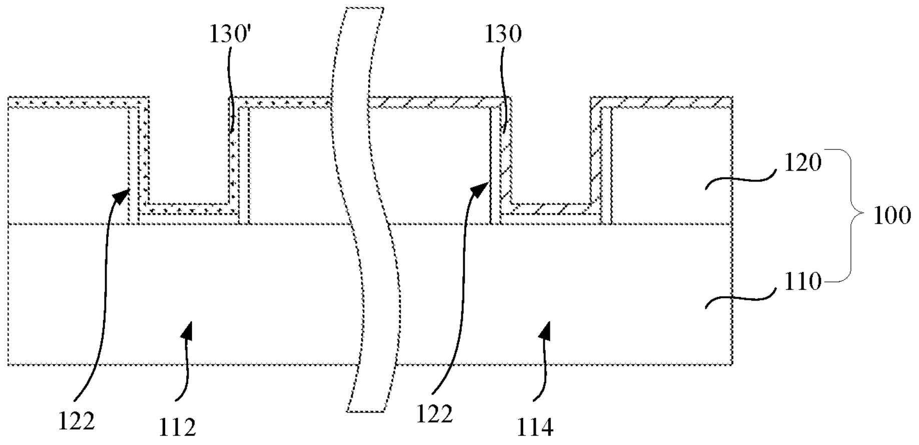
FIG. 9 is a schematic cross-sectional view of a structure resulting from removing the second barrier layer, a first metal material layer and the first barrier layer according to Embodiment 1 of the present invention.
Figure 10:
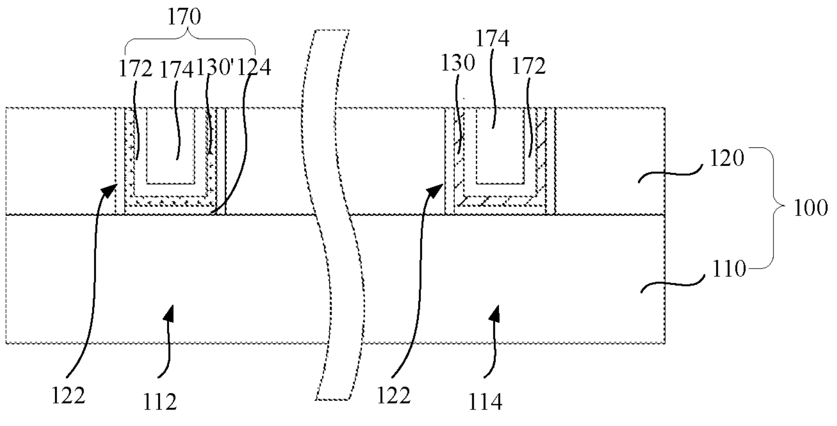
FIG. 10 is a schematic cross-sectional view of a structure resulting from forming gate structures in the trenches according to Embodiment 1 of the present invention.
Figure 11:
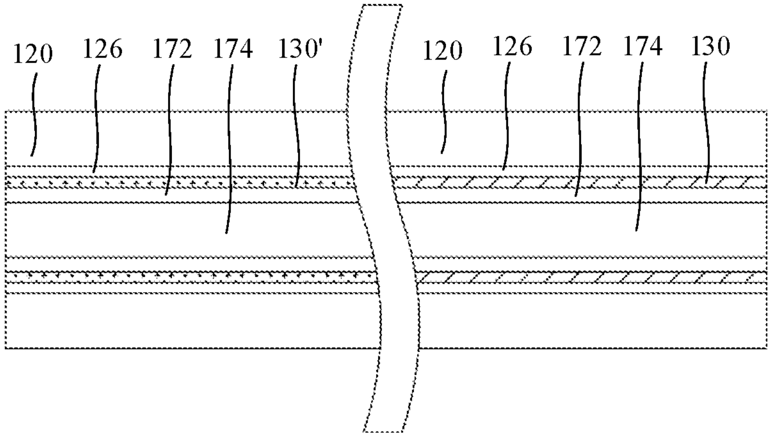
FIG. 11 is a schematic top view of the structure resulting from forming the gate structures in the trenches according to Embodiment 1 of the present invention.

Specifically, reference is made to FIGS. 2 to 11. FIGS. 2 to 10 are schematic cross-sectional views of intermediate structures that illustrate a method for fabricating a multi-threshold voltage semiconductor device according to Embodiment 1, and FIG. 11 is a schematic top view of a device resulting from the formation of gate structures in trenches according to Embodiment 1.

Figure 2:
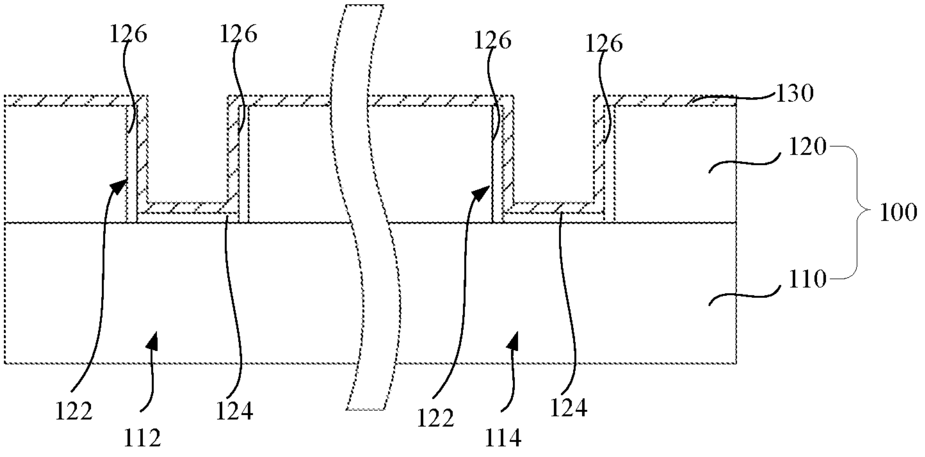
FIG. 2 is a schematic cross-sectional view of a structure resulting from providing a substrate according to Embodiment 1 of the present invention.

First of all, as shown in FIG. 2, a substrate 100 is provided, which includes a semiconductor substrate 110. The semiconductor substrate 110 may be made of silicon (Si), germanium (Ge), silicon germanium (SiGe), silicon carbide (SiC), gallium nitride (GaN), gallium arsenide (GaAs), aluminum gallium nitride (AlGaN) and/or the like. A plurality of doped regions (not shown) may be formed in the semiconductor substrate 110. The doped regions may be N-type or P-type regions, in which PMOS or NMOS transistors may be formed. As a non-limiting example, the doped regions may be spaced apart by shallow trench isolation (STI) structures.

The substrate 100 further includes an interlayer dielectric layer 120 on the semiconductor substrate 110. The interlayer dielectric layer 120 may be made of, for example, silicon oxide and/or silicon nitride.

As shown in FIG. 2, a plurality of gate trenches 122 are formed in the interlayer dielectric layer 120, each of which extends through the interlayer dielectric layer 120 and exposes the semiconductor substrate 110. In Embodiment 1, the number of the gate trenches 122 is same as the number of the doped regions of the semiconductor substrate 110, and the gate trenches 122 are provided in one-to-one correspondence with the doped regions. For ease of illustration, only two of the gate trenches 122 are schematically shown in FIG. 2, as well as two doped regions are formed in the semiconductor substrate 110, referred to hereinafter respectively as a first region 112 and a second region 114.

In Embodiment 1, a bottom wall of each gate trench 122 is lined with a gate dielectric layer 124. The gate dielectric layer 124 may be made of, for example, silicon oxide and/or silicon nitride. Side walls of each gate trench 122 may be covered by spacers 126. Without limitation, each spacer 126 may consist of a single layer, or of a stack of multiple layers. For example, each spacer 126 may include an oxide layer (not shown) covering the side wall of the gate trench 122 and a nitride layer (not shown) stacked on the oxide layer.

With continued reference to FIG. 2, a dielectric layer (here, a high-k dielectric layer 130) is formed in the gate trenches, the high-k dielectric layer 130 covers all the spacers and bottom walls of the gate trenches 122. In Embodiment 1, the high-k dielectric layer 130 covers the gate dielectric layer 124 and the spacers 126. The high-k dielectric layer 130 also covers a surface of the interlayer dielectric layer 120. The high-k dielectric layer 130 may be made of, for example, hafnium oxide ($HfO_2$), zirconium oxide ($ZrO_2$), hafnium silicate (HfSiO), hafnium silicon oxynitride (HfSiON), tantalum oxide ($Ta_2O_5$), titanium oxide ($TiO_2$), and/or aluminum oxide ($Al_2O_3$) and/or the like.

Figure 3:
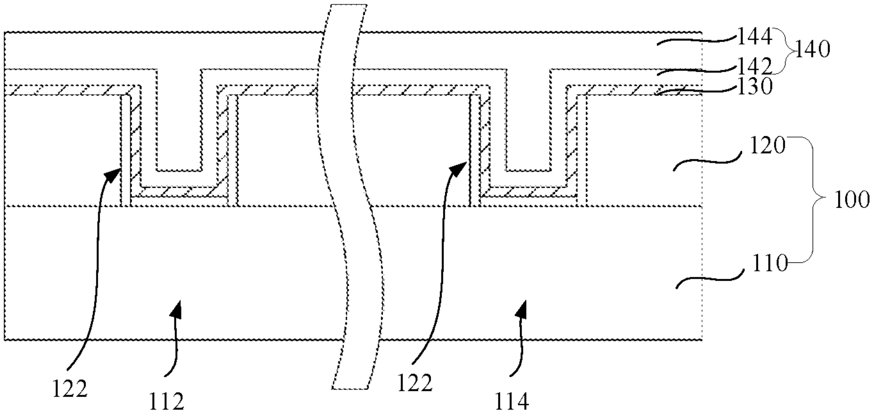
FIG. 3 is a schematic cross-sectional view of a structure resulting from forming a first barrier layer according to Embodiment 1 of the present invention.

As shown in FIG. 3, a first barrier layer 140 is formed, which covers the high-k dielectric layer 130. Optionally, the first barrier layer 140 includes a first titanium nitride layer 142 covering the high-k dielectric layer 130 and a first amorphous silicon layer 144 on the first titanium nitride layer 142. Optionally, the first titanium nitride layer 142 is formed using an atomic layer deposition (ALD) process and has a thickness smaller than or equal to 10 nm, such as, e.g., 3 nm, 5 nm, 7.5 nm or 10 nm. The first amorphous silicon layer 144 fills up and protrudes beyond the gate trenches 122. Optionally, after the first amorphous silicon layer 144 is deposited on the first titanium nitride layer 142, it may be planarized with a CMP process.

Figure 4:
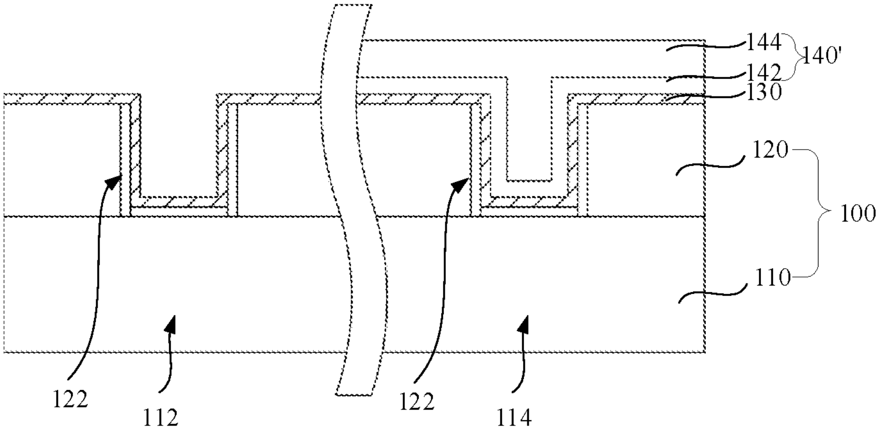
FIG. 4 is a schematic cross-sectional view of a structure resulting from exposing dielectric layer in some gate trenches according to Embodiment 1 of the present invention.

Referring to FIG. 4, in conjunction with FIG. 3, the first barrier layer 140 is partially removed by performing photolithography and etching processes thereon so that a portion of the high-k dielectric layer 130 (here, the high-k dielectric layer in the first region 112) is exposed, i.e., uncovered by the remaining portion of the first barrier layer 140'. Specifically, a photoresist layer (not shown) may be first formed on the first barrier layer 140 and then partially removed using a photolithography process, thus exposing a portion of the first barrier layer 140 aligned with the gate trench 122 in the first region 112. Next, the exposed portion of the first barrier layer 140 may be removed using an etching process, exposing the high-k dielectric layer 130 in the gate trench 122 in the first region 112. In Embodiment 1, the high-k dielectric layer 130 may be partially exposed by partially removing the first amorphous silicon layer 144 and the first titanium nitride layer 142 using a dry etching process and/or a wet etching process.

Figure 5:
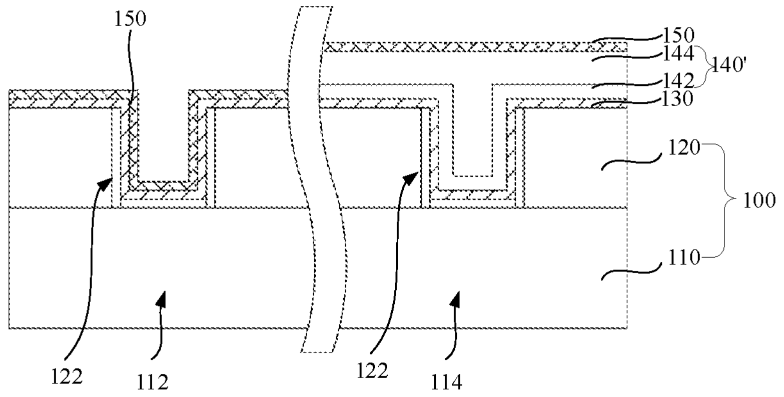
FIG. 5 is a schematic cross-sectional view of a structure resulting from forming a first metal material according to Embodiment 1 of the present invention.

After that, as shown in FIG. 5, a first metal material layer 150 is formed, which covers both the exposed high-k dielectric layer 130 and the remaining portion of the first barrier layer 140' in the second region 114. The first metal material layer 150 may be a metal-containing film. In Embodiment 1, the first metal material layer 150 may be lanthanum oxide ($La_2O_3$). In other embodiments of the present application, the first metal material layer 150 may be made of a metal containing another metal, a metal oxide, or the like. For example, the first metal material layer 150 may be aluminum, or aluminum titanide.

Figure 6:
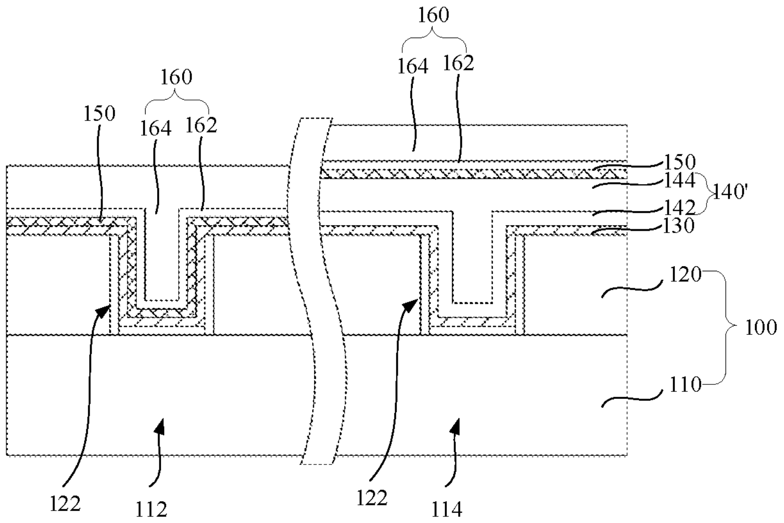
FIG. 6 is a schematic cross-sectional view of a structure resulting from forming a second barrier layer according to Embodiment 1 of the present invention.

Referring to FIG. 6, in Embodiment 1, a second barrier layer 160 is then formed, which covers the first metal material layer 150. Optionally, the second barrier layer 160 includes a second titanium nitride layer 162 on the first metal material layer 150 and a second amorphous silicon layer 164 stacked on the second titanium nitride layer 162. Optionally, the second titanium nitride layer 162 may be formed using an atomic layer deposition (ALD) process, followed by the formation of the second amorphous silicon layer 164 on the second titanium nitride layer 162.

Figure 7:
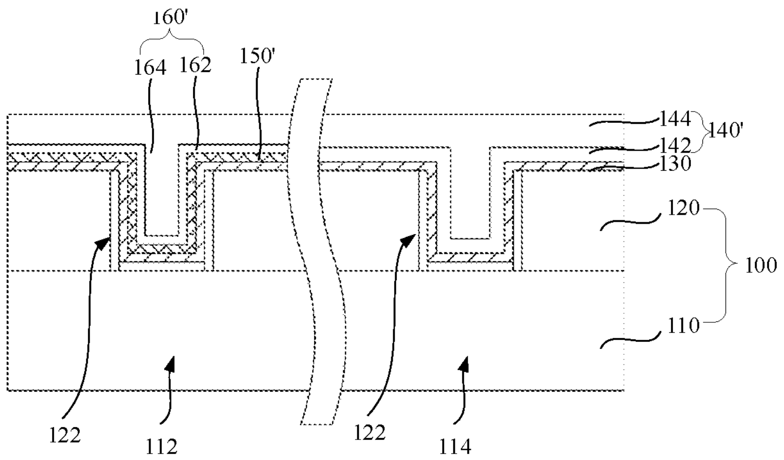
FIG. 7 is a schematic cross-sectional view of a structure resulting from performing a CMP process according to Embodiment 1 of the present invention.

Referring to FIG. 7, in Embodiment 1, the resulting structure is planarized using a CMP process. Specifically, the second barrier layer 160 and the first metal material layer 150 above the first barrier layer 140' are removed, exposing the first barrier layer 140'. Additionally, the second barrier layer 160 in the first region 112 may be thinned, and the remaining portion of the first barrier layer 140' and the remaining portion of the second barrier layer 160' are planarized. Thus, the resulting structure has a uniform flat surface.

Figure 8:
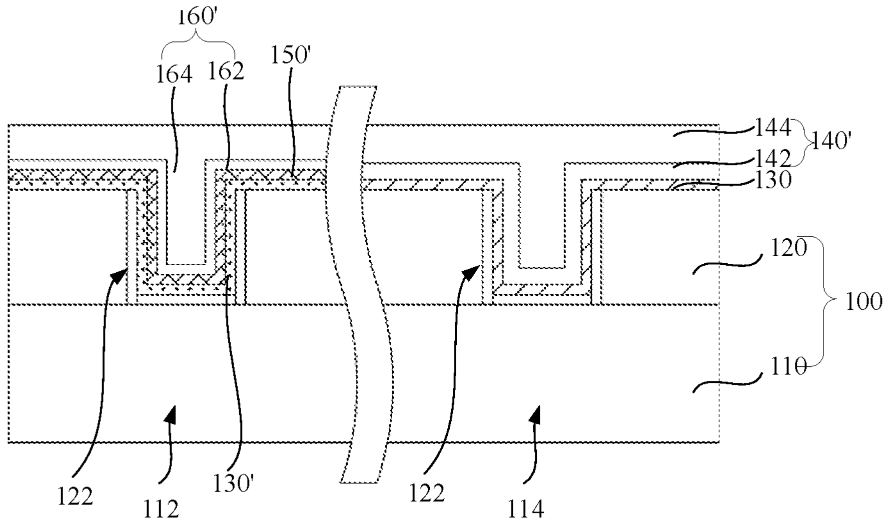
FIG. 8 is a schematic cross-sectional view of a structure resulting from performing an annealing process according to Embodiment 1 of the present invention.

Afterward, as shown in FIG. 8, an annealing process is carried out to cause diffusion of metal ions from the remaining portion of the first metal material layer 150' into the corresponding portion of high-k dielectric layer 130. Here, lanthanum ions are caused to diffuse into the high-k dielectric layer 130 in the first region 112, differentiating the high-k dielectric layer 130' in the first region 112 from the high-k dielectric layer 130 in the second region 114.

As shown in FIG. 9, the remaining portion of the second barrier layer 160', first metal material layer 150' and first barrier layer 140' are removed, exposing the high-k dielectric layer 130, 130'. As a non-limiting example, the removal thereof can be accomplished with a wet etching process.

Further, referring to FIGS. 10 and 11, work function layer 172 and gate electrodes 174 are formed in the gate trenches 122, resulting in the formation of gate structures 170 in the gate trenches 122. The work function layer 172 cover the high-k dielectric layer 130, 130' in the gate trenches 122, and the gate electrodes 174 fill up the gate trenches 122. The work function layer 172 may be formed of, for example, TiN, TaC, MON, TaN, TiAlC, TiAl and/or Ta. Depending on the electrical conductivity types of the doped regions in the semiconductor substrate 110, the portion of the work function layer 172 in the first region 112 may be identical to that in the second region 114, or not. In Embodiment 1, the gate electrodes 174 may be made of a metal, such as tungsten.

Since the portion of the high-k dielectric layer 130' in the first region 112 differs from the portion of the high-k dielectric layer 130 in the second region 114 in containing lanthanum ions that the latter does not contain, transistors to be formed in these regions will have different threshold voltages (Vt). Thus, in Embodiment 1, two different threshold voltages can be achieved with only one photolithography process and one etching process, making the multi-threshold voltage semiconductor device fabricated at lower cost. Moreover, the resulting multi-threshold voltage semiconductor devices exhibits improved consistency.

In Embodiment 1, a multi-threshold voltage semiconductor device fabricated according to the method as defined above is provided. With continued reference to FIGS. 10 and 11, the multi-threshold voltage semiconductor device includes: a semiconductor substrate 110; an interlayer dielectric layer 120 formed on the semiconductor substrate 110, in which at least two gate trenches 122 are formed; and gate structures 170 formed in the at least two gate trenches 122, wherein the gate structure include: a high-k dielectric layer 130, 130'; a work function layer 172 formed on the high-k dielectric layer 130, 130'; and a gate electrode 174 formed on the work function layer 172. The high-k dielectric layer 130, 130' in the at least two gate structures 170 differ from one another due to different metal ion diffusion conditions that they have experienced.

In Embodiment 1, the portion of the high-k dielectric layer 130' in one of the gate structures 170 has experienced diffusion of lanthanum ions therein, while no metal ions have been diffused into the portion of the high-k dielectric layer 130 in the other gate structure 170. Therefore, the transistors to be formed in these regions will have different threshold voltages (Vt).

Embodiment 2

Figure 12:
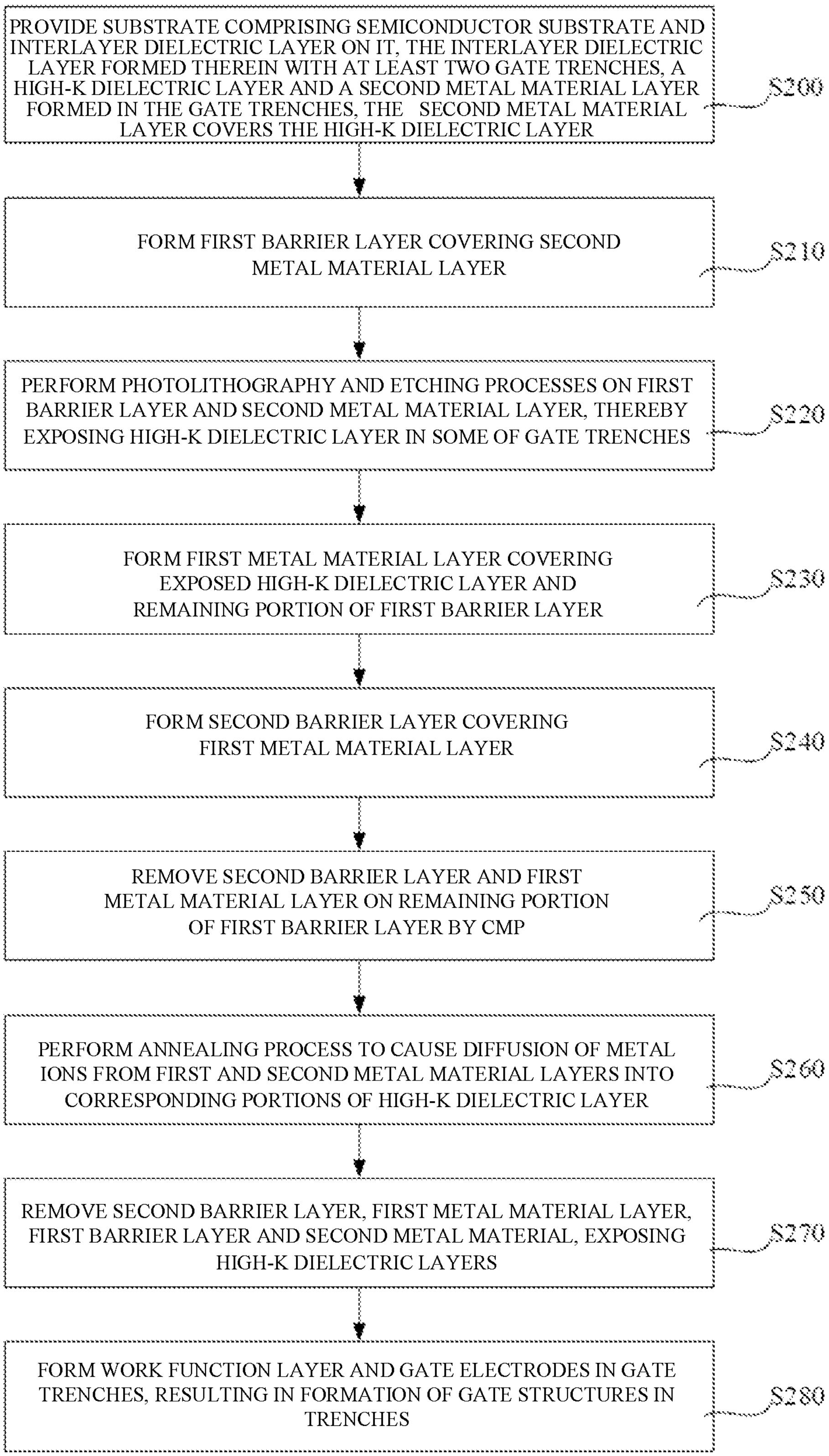
FIG. 12 is a schematic flow diagram of a method for fabricating a multi-threshold voltage semiconductor device according to Embodiment 2 of the present invention.

Reference is now made to FIG. 12, a schematic flow diagram of a method for fabricating a multi-threshold voltage semiconductor device according to Embodiment 2 of the present invention. As shown in FIG. 12, the method according to Embodiment 2 includes:

S200: providing a substrate comprising a semiconductor substrate and an interlayer dielectric layer formed on the semiconductor substrate, the interlayer dielectric layer formed therein with at least two gate trenches, a high-k dielectric layer and a second metal material layer formed in the gate trenches, wherein the second metal material layer covers the high-k dielectric layer;

S210: forming a first barrier layer covering the second metal material layer;

S220: exposing the high-k dielectric layer in some of the gate trenches by performing photolithography and etching processes on the first barrier layer and the second metal material layer;

S230: forming a first metal material layer covering the exposed high-k dielectric layer and the remaining portion of the first barrier layer;

S240: forming a second barrier layer covering the first metal material layer;

S250: removing the second barrier layer and the first metal material layer on the remaining portion of the first barrier layer by CMP;

S260: performing an annealing process to cause diffusion of metal ions from the first and second metal material layers into the corresponding portions of the high-k dielectric layer;

S270: removing the second barrier layer, the first metal material layer, the first barrier layer and the second metal material layer, thereby exposing the high-k dielectric layer; and

S280: forming work function layer and gate electrodes in the gate trenches, resulting in the formation of gate structures in the trenches.

Embodiment 2 differs from Embodiment 1 primarily as follows:

In Embodiment 1, one photolithography process and one etching process are employed to form a metal material layer over at least one trench, but not over at least one other trench. This allows an annealing process to drive metal ions into the high-k dielectric layer in at least one trench but not into the high-k dielectric layer in at least one other trench, resulting in different threshold voltages of transistors to be formed.

In Embodiment 2, one photolithography process and one etching process are employed to form different metal material layers over at least two trenches, allowing an annealing process to drive different metal ions into the respective portions of the high-k dielectric layer in the trenches and thereby resulting in different threshold voltages of transistors to be formed.

The following description focuses on differences of Embodiment 2 from Embodiment 1. Any feature common to these two Embodiments that has been discussed in Embodiment 1 will not be repeated, and reference can be made to the above description of Embodiment 1 for its details.

Figure 20:
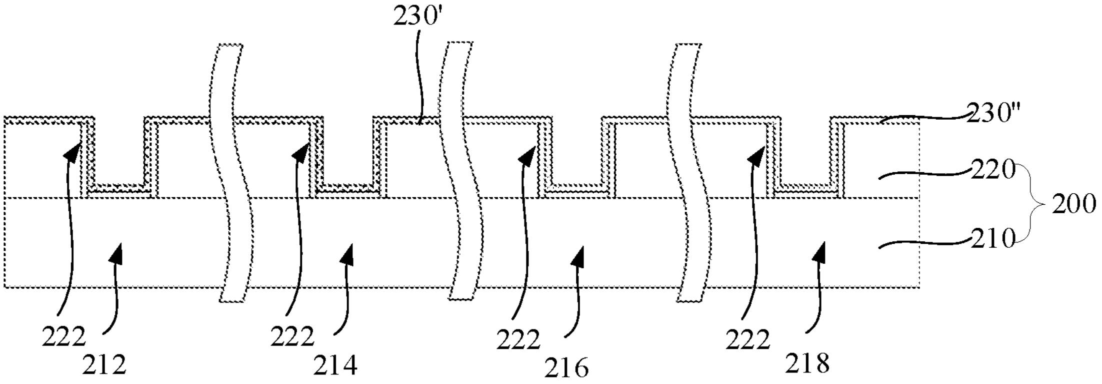
FIG. 20 is a schematic cross-sectional view of a structure resulting from removing the second barrier layer, the first metal material layer, the first barrier layer and a second metal material layer according to Embodiment 2 of the present invention.
Figure 21:
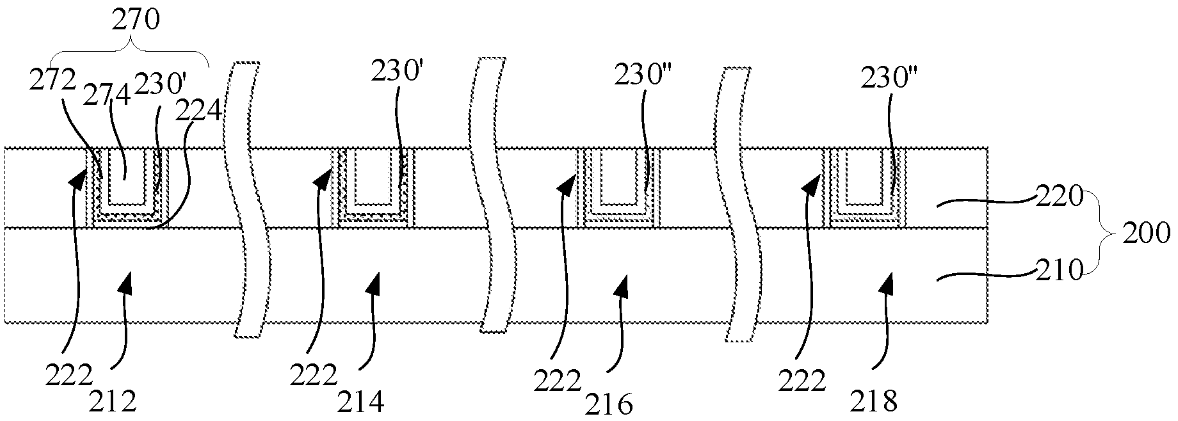
FIG. 21 is a schematic cross-sectional view of a structure resulting from forming gate structures in the trenches according to Embodiment 2 of the present invention.
Figure 22:
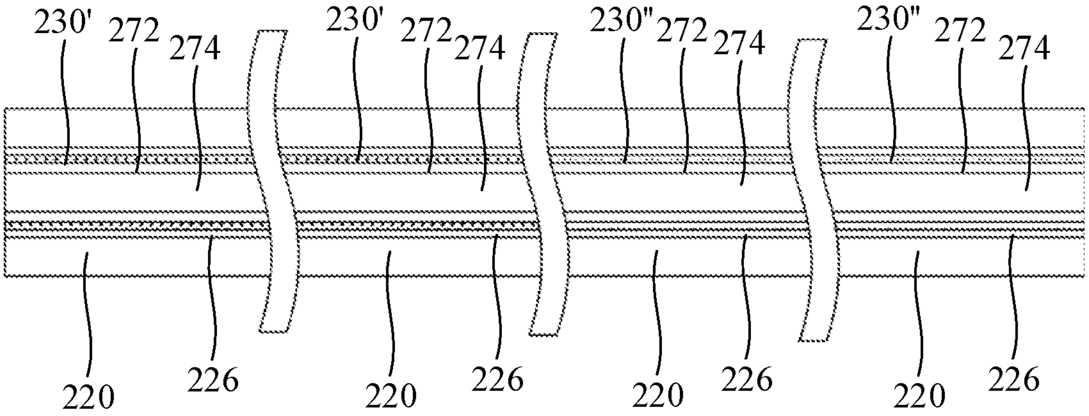
FIG. 22 is a schematic top view of the structure resulting from forming the gate structures in the trenches according to Embodiment 2 of the present invention.

Specifically, reference is to be made to FIGS. 13 to 22. FIGS. 13 to 21 are schematic cross-sectional views of intermediate structures that illustrate a method for fabricating a multi-threshold voltage semiconductor device according to Embodiment 2, and FIG. 22 is a schematic top view of a device resulting from the formation of gate structures in trenches according to Embodiment 2.

Figure 13:
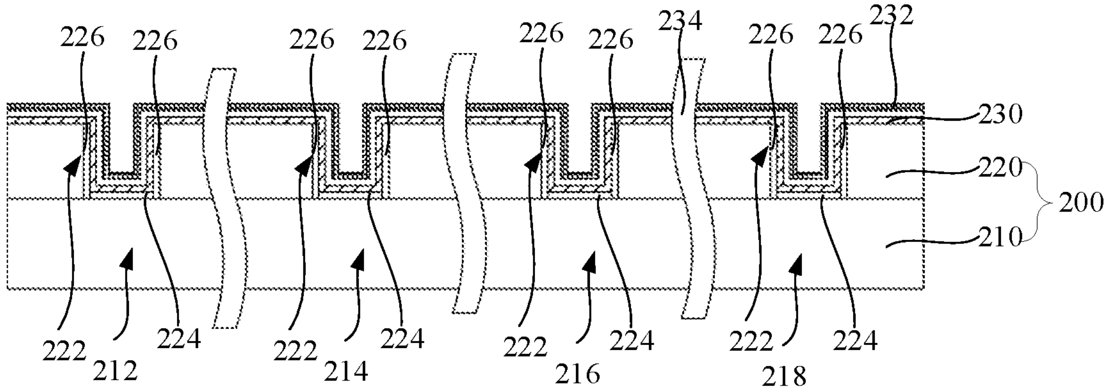
FIG. 13 is a schematic cross-sectional view of a structure resulting from providing a substrate according to Embodiment 2 of the present invention.

As shown in FIG. 13, a plurality of gate trenches 222 are formed in an interlayer dielectric layer 220, each of which extends through the interlayer dielectric layer 220 and exposes a semiconductor substrate 210. In Embodiment 2, the number of the gate trenches 222 is same as the number of the doped regions of the semiconductor substrate 210, and the gate trenches 222 are provided in one-to-one correspondence with the doped regions. For ease of illustration, only four of the gate trenches 222 are schematically shown in FIG. 13, as well as the four doped regions in the semiconductor substrate 210, referred to hereinafter respectively as a first region 212, a second region 214, a third region 216 and a fourth region 218. Two of the first region 212, the second region 214, the third region 216 and the fourth region 218 are N-type doped regions, and the remaining two are P-type doped regions. For example, the first region 212 and the third region 216 may be N-type doped regions, and the second region 214 and the fourth region 218 may be P-type doped regions.

In Embodiment 2, each gate trench 222 is formed therein with a second metal material layer 232 covering a high-k dielectric layer 230. The second metal material layer 232 is a metal-containing film. In Embodiment 2, the second metal material layer 232 is aluminum (Al) optionally with a thickness in the range of 10 Å to 30 Å. In other embodiments of the present application, the second metal material layer 232 may be another metal-containing material, such as aluminum titanide (TiAl) optionally with a thickness in the range of 15 Å to 45 Å. The material of the second metal material layer 232 and its thickness may be selected so that a better controlled amount of metal ions can diffuse in a subsequent annealing process, resulting in a desired threshold voltage (Vt) to be formed.

In addition, in each gate trench 222, an isolation layer 234 may be further formed over the high-k dielectric layer 230, and the second metal material layer 232 may cover the isolation layer 234. That is, the isolation layer 234 is interposed between the high-k dielectric layer 230 and the second metal material layer 232. The isolation layer 234 may be a titanium nitride (TiN) layer.

Figure 14:
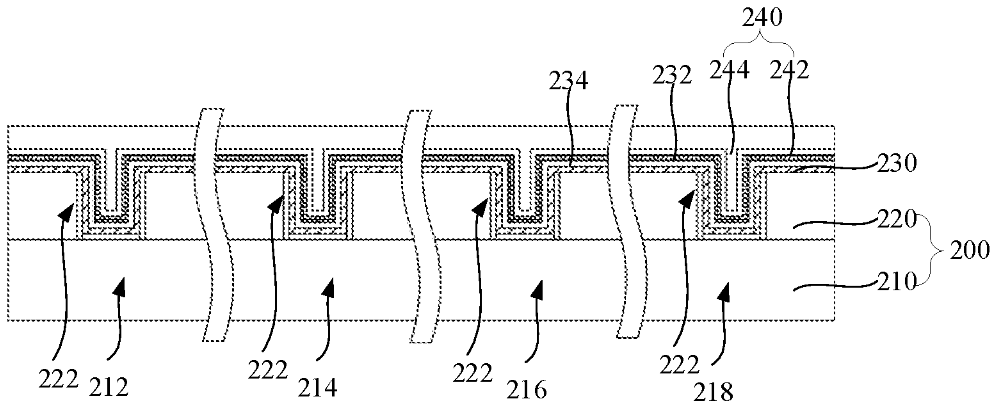
FIG. 14 is a schematic cross-sectional view of a structure resulting from forming a first barrier layer according to Embodiment 2 of the present invention.

Referring to FIG. 14, a first barrier layer 240 is formed over the second metal material layer 232. Optionally, the first barrier layer 240 includes a first titanium nitride layer 242 covering the second metal material layer 232 and a first amorphous silicon layer 244 over the first titanium nitride layer 242.

Figure 15:
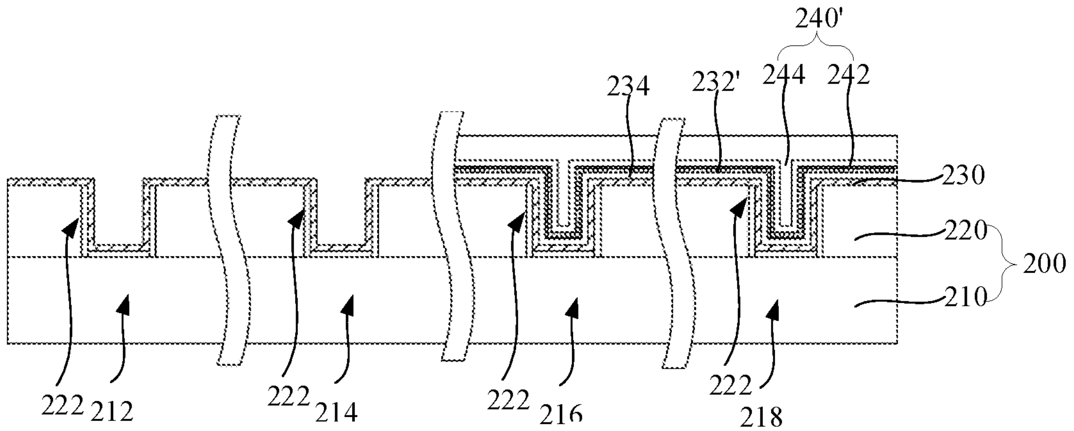
FIG. 15 is a schematic cross-sectional view of a structure resulting from exposing dielectric layer in some gate trenches according to Embodiment 2 of the present invention.

Afterwards, as shown in FIG. 15, photolithography and etching processes are performed on the first barrier layer 240 and the second metal material layer 232, removing a portion of the first barrier layer 240 and a portion of the second metal material layer 232. As a result, portions of the high-k dielectric layer 230 in some of the gate trenches 222 are exposed, i.e., uncovered by the remaining portion of the first barrier layer 240' and the second metal material layer 232'. In Embodiment 2, the high-k dielectric layer 230 in the first region 212 and the second region 214 are exposed.

Figure 16:
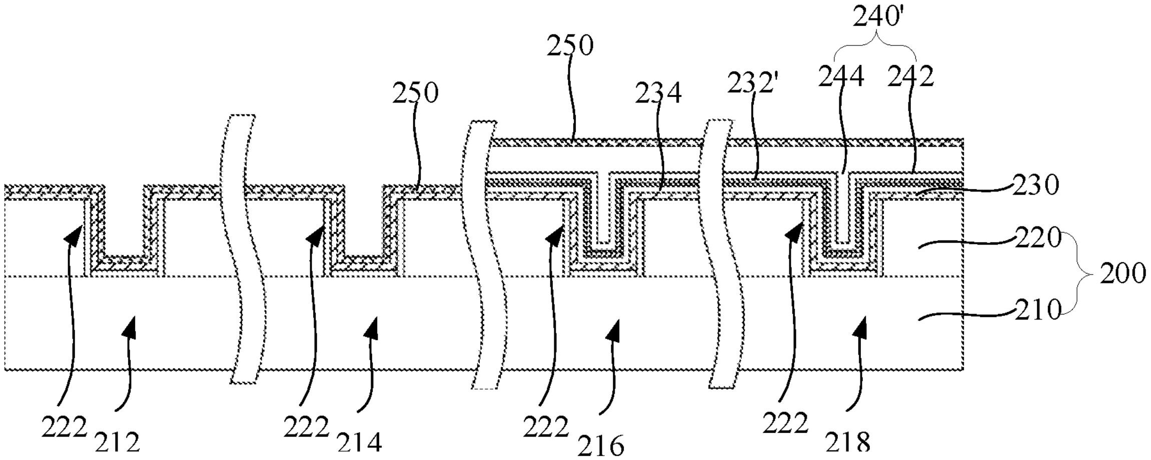
FIG. 16 is a schematic cross-sectional view of a structure resulting from forming a first metal material layer according to Embodiment 2 of the present invention.

Referring to FIG. 16, a first metal material layer 250 is formed, which covers the exposed high-k dielectric layer 230 and the remaining portion of the first barrier layer 240'. That is, the first metal material layer 250 covers the exposed high-k dielectric layer 230, and extends and covers the first barrier layer 240' in the third region 216 and the fourth region 218. The first metal material layer 250 is a metal-containing film. The first metal material layer 250 and the second metal material layer 232 are different materials. In Embodiment 2, the first metal material layer 250 is lanthanum oxide ($La_2O_3$). In other embodiments of the present application, the first metal material layer 250 may be made of a metal containing another metal, a metal oxide, or the like, as long as material of the first metal material layer differs from the material of the second metal material layer 232.

Figure 17:
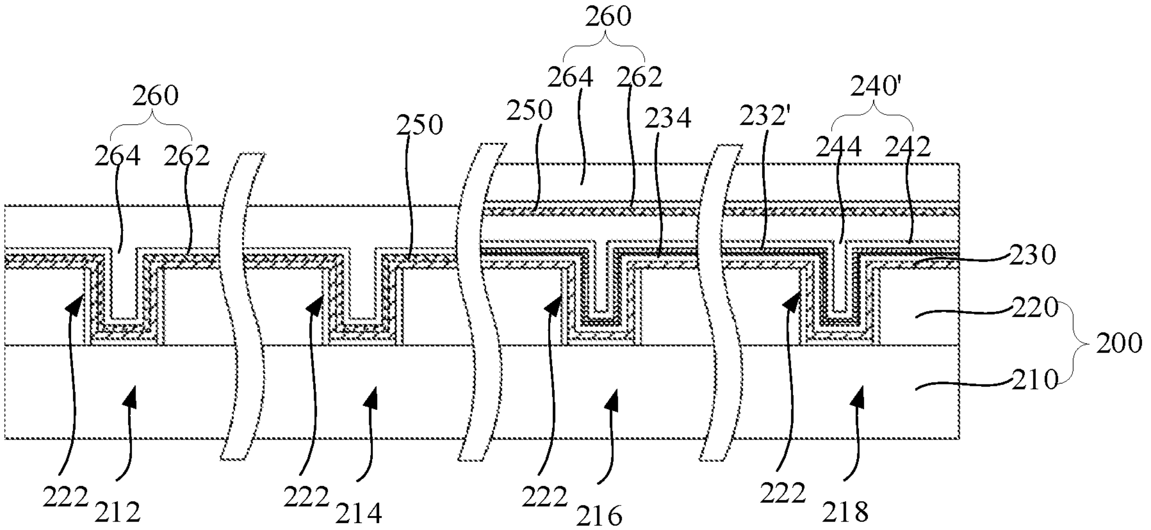
FIG. 17 is a schematic cross-sectional view of a structure resulting from forming a second barrier layer according to Embodiment 2 of the present invention.

As shown in FIG. 17, a second barrier layer 260 is formed, which covers the first metal material layer 250.

Figure 18:
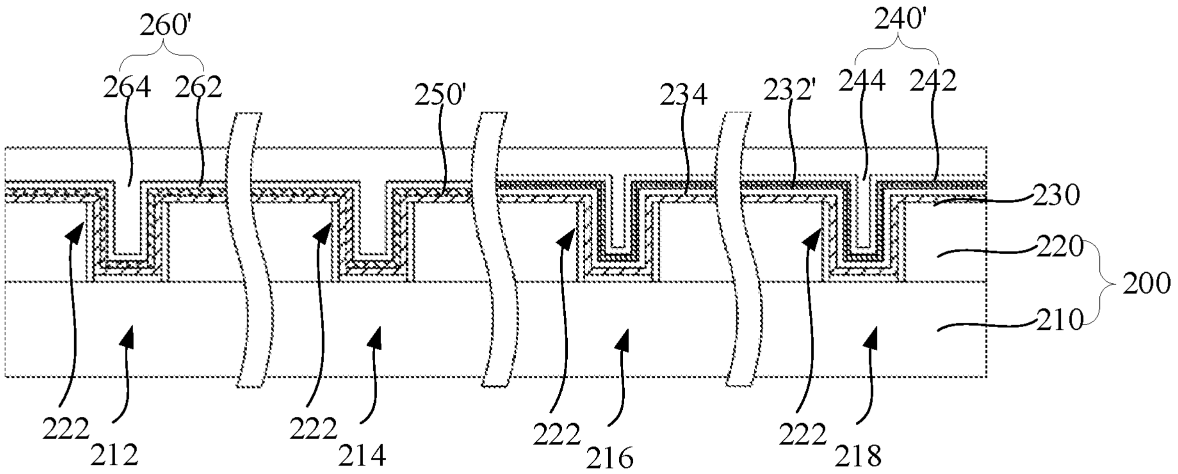
FIG. 18 is a schematic cross-sectional view of a structure resulting from performing a CMP process according to Embodiment 2 of the present invention.

Referring to FIG. 18, in Embodiment 2, a CMP process is further performed to planarize the resulting structure. Specifically, the second barrier layer 260 and the first metal material layer 250 are partially removed so that the first barrier layer 240' is uncovered by the remaining portion of the second barrier layer 260' and the remaining portion of the first metal material layer 250'.

Figure 19:
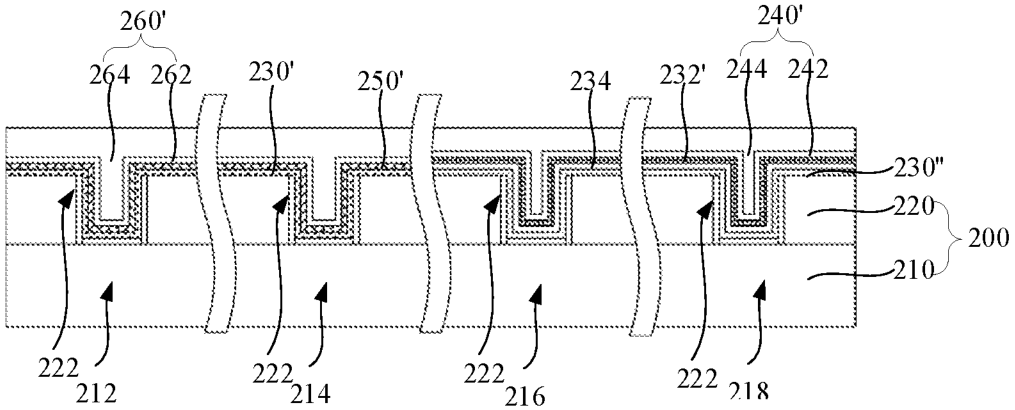
FIG. 19 is a schematic cross-sectional view of a structure resulting from performing an annealing process according to Embodiment 2 of the present invention.

As shown in FIG. 19, an annealing process is carried out to cause diffusion of metal ions from the first metal material layer 250' into the corresponding portions of the high-k dielectric layer 230. Here, lanthanum ions are caused to diffuse into the high-k dielectric layer 230 in the first region 212 and the second region 214. In Embodiment 2, the annealing process also drives metal ions from the second metal material layer 232' into the corresponding portions of the high-k dielectric layer 230. Here, aluminum ions are caused to diffuse into the high-k dielectric layer 230 in the third region 216 and the fourth region 218. As a result, the portions of the high-k dielectric layer 230' in the first region 212 and the second region 214 are differentiated from the portions of the high-k dielectric layer 230" in the third region 216 and the fourth region 218.

As shown in FIG. 20, the second barrier layer 260', the first metal material layer 250', the first barrier layer 240' and the second metal material layer 232' are then removed, exposing the portions of the high-k dielectric layer 230', 230".

Next, referring to FIGS. 21 and 22, work function layer 272 and gate electrodes 274 are formed in the gate trenches 222, resulting in the formation of gate structures 270 in the gate trenches 222.

Since the high-k dielectric layer 230' in the first region 212 and the second region 214 differ from the high-k dielectric layer 130" in the third region 216 and the fourth region 218 because the high-k dielectric layer 230' in the first region 212 and the second region 214 contain lanthanum ions while the high-k dielectric layer 130" in the third region 216 and the fourth region 218 contain aluminum ions, transistors to be formed in these regions will have different threshold voltages (Vt). Moreover, the first region 212 and the second region 214 are N-type and P-type doped regions, respectively, and the third region 216 and the fourth region 218 are N-type and P-type doped regions, respectively. That is, the same metal ions diffusing into two portions of the high-k dielectric layer 230 that are doped of different electrical conductivity types results in the formation of different types of transistors with different threshold voltages (Vt). In other words, in Embodiment 2, four different threshold voltages can be obtained with only one photolithography process and one etching process, lowering fabrication cost of the multi-threshold voltage semiconductor device. Moreover, the fabricated multi-threshold voltage semiconductor device exhibits increased consistency.

In Embodiment 2, a multi-threshold voltage semiconductor device fabricated according to the method as defined above is provided. With continued reference to FIGS. 21 and 22, the multi-threshold voltage semiconductor device includes: a semiconductor substrate 210; an interlayer dielectric layer 220 formed on the semiconductor substrate 210, wherein the interlayer dielectric layer 220 is formed therein with at least two gate trenches 222; and gate structures 270 in the gate trenches 222, wherein each gate structure includes a portion of a high-k dielectric layer 230' or 230", a portion of a work function layer 272 formed on the high-k dielectric layer 230' or 230" and a gate electrode 274 on the work function layer 272. The portion of the high-k dielectric layer 230' and the portion of the high-k dielectric layer 230" in the at least two gate structures 270 differ from one another due to different metal ion diffusion conditions that they have experienced.

In Embodiment 2, four gate trenches 222 are formed in the interlayer dielectric layer 220. The portions of high-k dielectric layer 230' in two of them have experienced diffusion of lanthanum ions therein, and the two gate trenches 222 are formed in doped regions of different electrical conductivity types. The portions of the high-k dielectric layer 230' in the remaining two gate trenches 222 have experienced diffusion of aluminum ions therein, and the two gate trenches 222 are also formed in doped regions of different electrical conductivity types. Therefore, four transistors to be formed in the respective regions will exhibit different threshold voltages (Vt).

As verified, NFETs with Vt~0.2V and ~0.4V and PFETs with Vt ~−0.3V and ~−0.1V were obtained according to the method discussed above. Thus, four different threshold voltages can be obtained with only one photolithography process and one etching process. Conventionally, this would have required the involvement of more photolithography processes and more etching processes. Thus, fabrication of a multi-threshold voltage semiconductor device according to the method of Embodiment 2 can be accomplished at lower cost, and the resulting multi-threshold voltage semiconductor device exhibits improved consistency.

In other embodiments of the present application, more different threshold voltages (Vt) can be obtained by adding photolithography and etching processes. For example, there may be at least six gate trenches in the interlayer dielectric layer, and one photolithography process and one etching processes may be added to Embodiment 2 to allow the high-k dielectric layer in the remaining two gate trenches of different electrical conductivity types not to experience diffusion of metal ions therein. In this way, six transistors each with a different threshold voltage (Vt) can be formed in the respective regions. According to this application, through different combinations of features, multiple different threshold voltages may be achieved with fewer photolithography and etching processes and thus lowering the fabrication cost of a multi-threshold voltage semiconductor device. Moreover, the resulting multi-threshold voltage semiconductor device exhibits higher consistency.

In other implementations of the present application, the features of the appended claims and the foregoing embodiments may be combined in different combinations to form new embodiments, which, however, will not be enumerated herein. In light of the above disclosure, those of ordinary skill in the art can make more variations without exerting any creative effort.

The description presented above is merely that of some preferred embodiments of the present invention and is not intended to limit the scope thereof in any sense. Any and all changes and modifications made by those of ordinary skill in the art based on the above teachings fall within the scope as defined in the appended claims.

What is claimed is:

1. A method for fabricating a multi-threshold voltage semiconductor device, comprising:

providing a substrate, wherein the substrate comprises a semiconductor substrate and an interlayer dielectric layer formed on the semiconductor substrate, wherein at least two gate trenches are formed in the interlayer dielectric layer, and wherein a dielectric layer is formed in the gate trenches;

forming a first barrier layer covering the dielectric layer;

exposing the dielectric layer in a part of the gate trenches by performing photolithography and etching processes on the first barrier layer;

forming a first metal material layer covering the exposed dielectric layer and a remaining portion of the first barrier layer;

forming a second barrier layer covering the first metal material layer;

removing the second barrier layer and the first metal material layer that are located above the remaining portion of the first barrier layer by a chemical mechanical polishing (CMP);

performing an annealing process to cause diffusion of metal ions from the first metal material layer into at least one corresponding portion of the dielectric layer;

removing the second barrier layer, the first metal material layer and the first barrier layer, thereby exposing the dielectric layer; and forming a work function layer and gate electrodes in the gate trenches, so as to form a gate structure in each trench.

2. The method of claim 1, wherein a second metal material layer is further formed in the trenches, wherein the second metal material layer covers the dielectric layer, and wherein:

the first barrier layer covers the second metal material layer; and removing the second metal material layer with the first barrier layer by performing the photolithography and etching processes thereon.

3. The method of claim 2, wherein the metal ions diffuse from the second metal material layer into at least one corresponding portion of the dielectric layer by the annealing process.

4. The method of claim 2, wherein an isolation layer is further formed in the gate trenches, wherein the isolation layer covers the dielectric layer, and wherein the dielectric layer is covered by the second metal material layer.

5. The method of claim 1, wherein the gate trench is further formed therein with spacers covering side walls of the gate trench, and wherein the dielectric layer covers the spacers and a bottom wall of the gate trench.

6. The method of claim 1, wherein: the first metal material layer is a lanthanum oxide layer; the first barrier layer comprises a first titanium nitride layer and a first amorphous silicon layer located over the first titanium nitride layer; and the second barrier layer comprises a second titanium nitride layer and a second amorphous silicon layer located over the second titanium nitride layer.

7. The method of claim 2, wherein the second metal material layer is an aluminum layer or an aluminum titanide layer.

8. The method of claim 1, wherein a plurality of doped regions are formed in the semiconductor substrate, which are N-type or P-type doped regions, and wherein each gate trench is aligned with a corresponding doped region.

* * * * *